US006226171B1

United States Patent
Beilin et al.

(10) Patent No.: US 6,226,171 B1
(45) Date of Patent: May 1, 2001

(54) POWER CONDUCTING SUBSTRATES WITH HIGH-YIELD INTEGRATED SUBSTRATE CAPACITOR

(75) Inventors: Solomon I. Beilin, San Carlos; William T. Chou, Cupertino; Michael G. Lee; David Dung Ngo, both of San Jose; Michael G. Peters, Santa Clara; James J. Roman, Sunnyvale; Yasuhito Takahashi, San Jose, all of CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/227,239

(22) Filed: Jan. 8, 1999

(Under 37 CFR 1.47)

Related U.S. Application Data
(60) Provisional application No. 60/083,121, filed on Apr. 27, 1998.

(51) Int. Cl.[7] .................................................. H01G 4/228
(52) U.S. Cl. ..................................... 361/306.3; 361/321.3; 361/313; 257/532
(58) Field of Search ................................ 361/305, 306.1, 361/306.2, 306.3, 303, 311–313, 321.2, 321.3, 329; 257/528, 532; 427/79

(56) References Cited

U.S. PATENT DOCUMENTS

| | | |
|---|---|---|
| 3,969,197 | 7/1976 | Tolar et al. . |
| 4,002,545 | 1/1977 | Fehiner et al. . |
| 4,589,056 | 5/1986 | Stimmell . |
| 4,589,961 | 5/1986 | Gershenson . |
| 4,827,323 | 5/1989 | Tigelaar et al. . |
| 4,890,192 | 12/1989 | Smith . |
| 5,134,539 | 7/1992 | Tuckerman et al. . |
| 5,141,603 | 8/1992 | Dickey et al. . |
| 5,404,265 | 4/1995 | Moresco et al. . |

*Primary Examiner*—Anthony Dinkins
(74) *Attorney, Agent, or Firm*—Coudert Brothers

(57) ABSTRACT

Several inventive features for increasing the yield of substrate capacitors are disclosed. The inventive features relating to selective placement of insulating layers and patches around selected areas of the capacitor's main dielectric layer. These insulating layers and defects prevent certain manufacturing processing steps from creating pin-hole defects in the main dielectric layer. The inventive features are suitable for any type of material for the main dielectric layer, and are particularly suited to anodized dielectric layers.

22 Claims, 7 Drawing Sheets

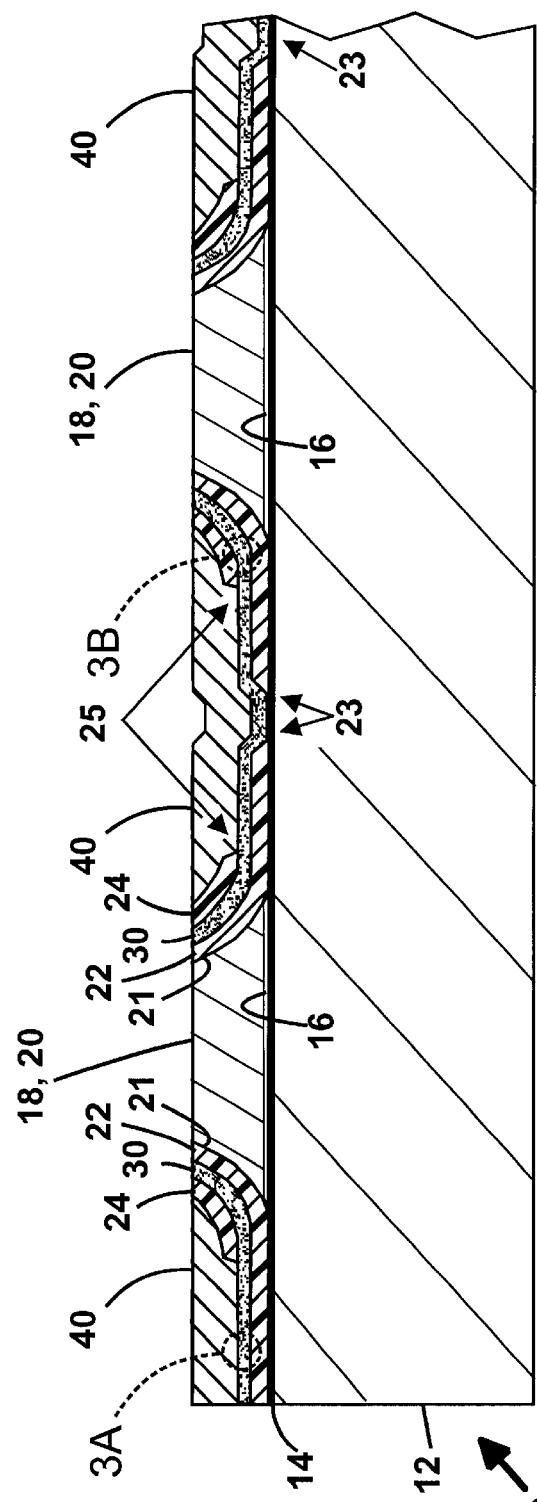
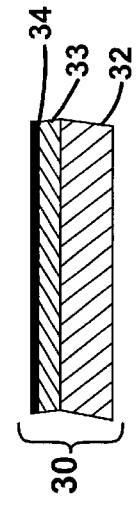
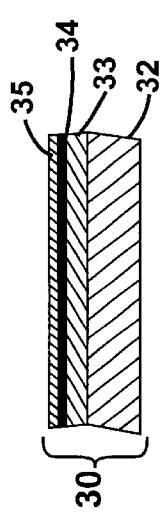

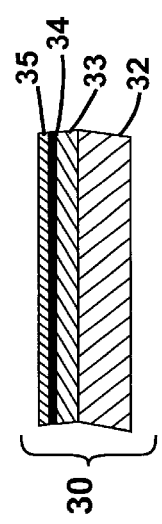
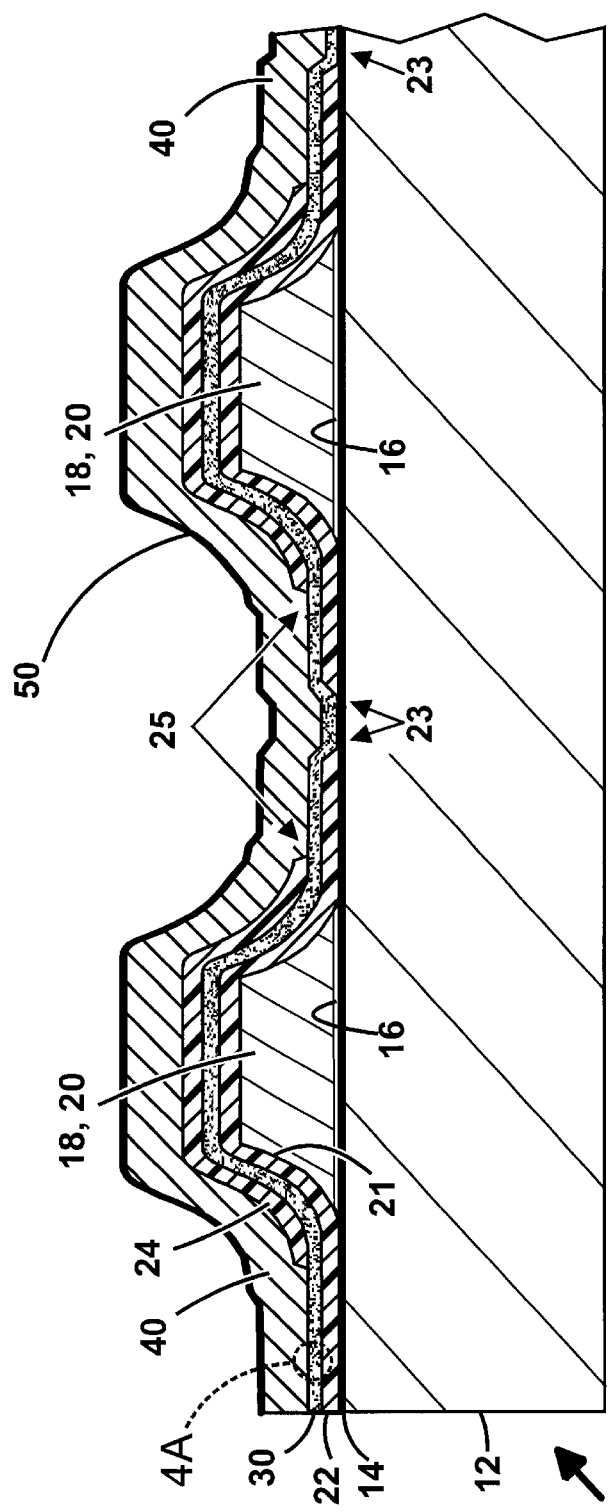

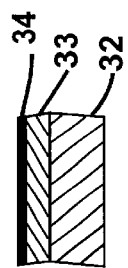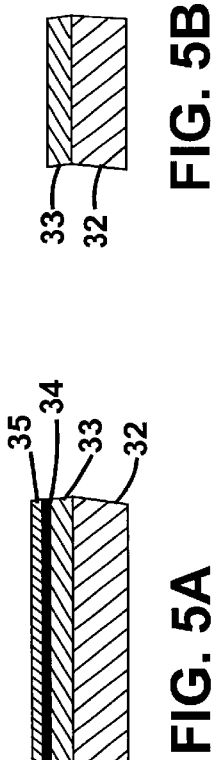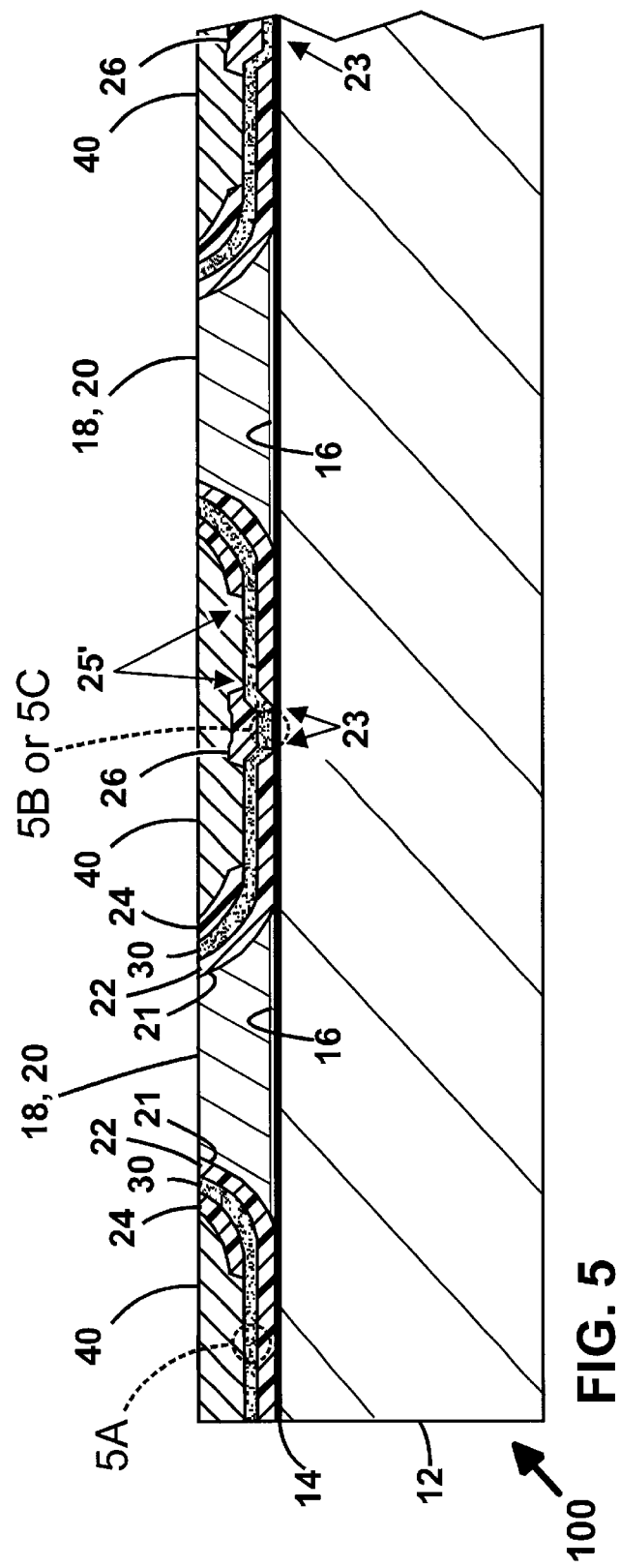

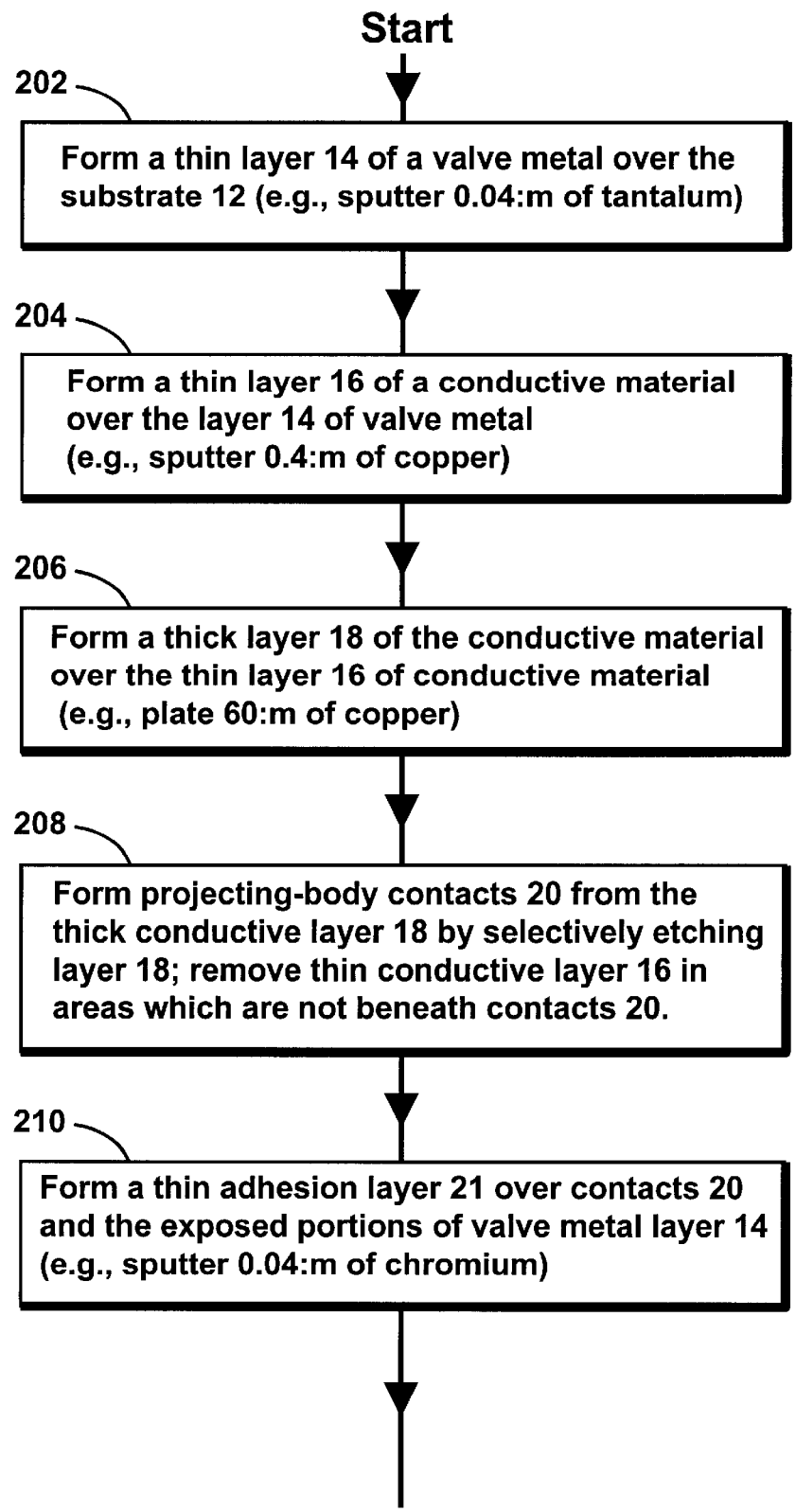
FIG._6A

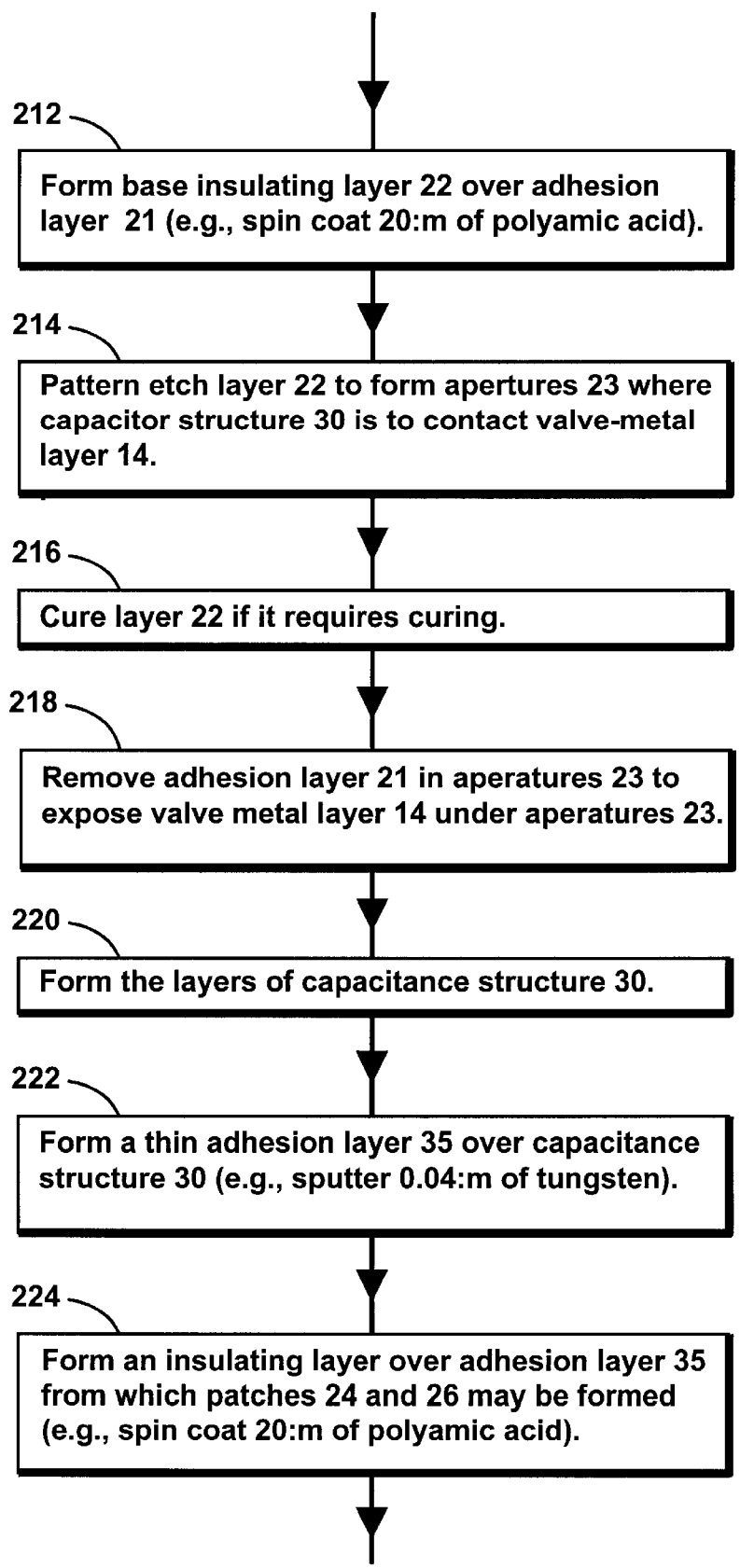
FIG._6B

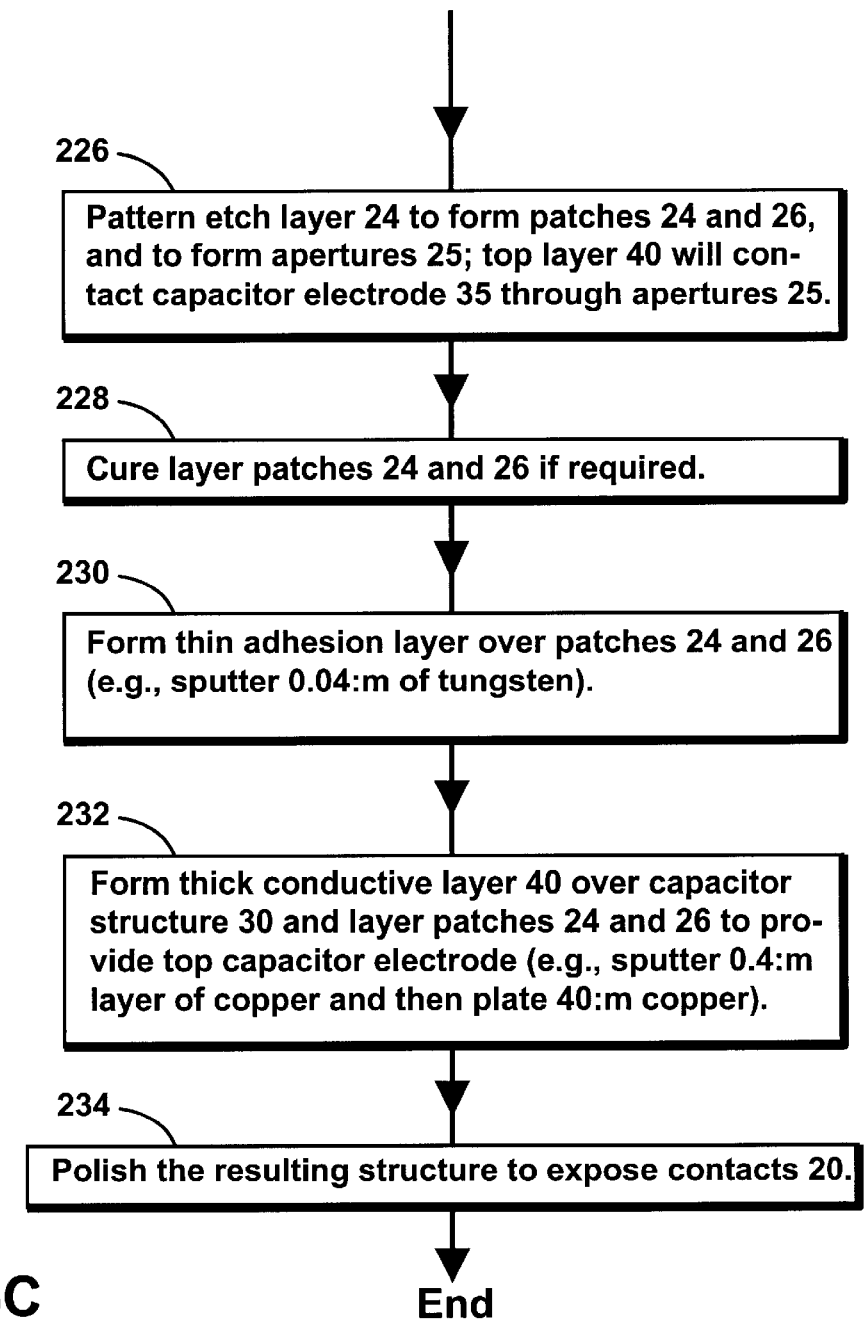
FIG._6C

POWER CONDUCTING SUBSTRATES WITH HIGH-YIELD INTEGRATED SUBSTRATE CAPACITOR

CROSS-REFERENCE TO RELATED APPLICATIONS

This application claims the benefit of U.S. Provisional Application No. 60/083,121 filed Apr. 27, 1998 now abandoned.

FIELD OF THE INVENTION

The present invention relates to power conducting substrates having one or more capacitor structures formed therein and methods for making the same. More particularly, the present invention is related to the fabrication of such capacitors for Multichip Modules and the like where the substrates extend over large areas.

BACKGROUND OF THE INVENTION

As the clock rates and the IC density increase in multichip modules (MCMs), power supply noise becomes a more serious problem. It becomes more desirable to position decoupling capacitors closer to the chips and therefore to more effectively isolate the active devices from the switching transients because of the reduced inductance that comes with closer positioning. Approaches to accomplish this include either incorporating a thin film capacitor structure into the multichip module as an integral capacitor or placing the decoupling capacitors between the chip and multichip module, such as on interposer substrates.

One drawback of using decoupling capacitors disposed on interposer substrates is that the amount of chip assembly is doubled. Another drawback is that the chances of solder bump failure can be doubled. A thin film capacitor which is integrated into the body of the multichip module would not have these drawbacks, and therefore is appealing. However, the manufacturing of integrated thin film capacitors faces several technological hurdles before these capacitors can be reliable and economical.

One of these issues is that the integral capacitor needs to be compatible with the dielectric and metal layers used in the multichip module, and with the processing steps used to form these layers. Therefore, the processing conditions and temperatures used to fabricate the integrated capacitor must not degrade the dielectric and metal layers, and, conversely, the integrated capacitor must have sufficient thermal stability such that its electrical characteristics are not degraded by the formation of the dielectric and metal layers. For example, the formation of a conventional copper-polyimide multichip module requires that each polyimide layer be cured at a high temperature of 300° C. to 450° C. for 30 minutes to 2 hours, depending on the thickness and chemical composition of the polyimide layer, which would expose an integrated capacitor structure to several extended periods at high temperature. These issues have been addressed by Applicants' co-pending U.S. patent application Ser. No. 08/826,980, now U.S. Pat. No. 5,872,696 entitled "SPUTTERED AND ANODIZED CAPACITORS CAPABLE OF WITHSTANDING EXPOSURE TO HIGH TEMPERATURES," assigned to the same assignee of the present application, and incorporated herein by reference.

As another technological hurdle to be addressed, because the integrated capacitor is formed over a large area, defect density of the thin film integrated capacitor is an important characteristic and must be reduced to increase reliability and manufacturing yields. Furthermore, the capacitor should have as high a capacitance value as possible to be the most effective, which requires the use of a high dielectric constant material and/or the use of a very thin dielectric layer. Unfortunately, the use of thin dielectric layers significantly increases defect densities. Applicants' above-identified U.S. patent application has addressed these issues in a manner which enables substrate capacitors using anodized dielectric to be manufactured reliably and inexpensively. The use of an anodization material to form the capacitor's dielectric layer offers significant advantages over other formation techniques. Such materials generally provide the highest dielectric constants available for capacitor materials, and the anodization process heals many (but not all) types of defects and enables the dielectric layer to be formed in a controlled and uniform manner. A number of inventive features of the present patent application are directed to further structures and procedures which further improved the reliability of the substrate capacitor.

As an additional consideration to constructing substrate capacitors, the series resistance in the electrodes of the integrated capacitor should be kept low to avoid voltage drops across the capacitor during transient current spikes, and to improve transient response time. This consideration complicates the resolution of the above more serious issues by limiting the available options, and may introduce yet additional problems. As an example of such an additional problem, many researchers have tried to construct a capacitor with aluminum (Al) electrodes for good conductivity and a tantalum pentoxide ($Ta_2O_5$) dielectric layer for a high dielectric constant. However, these researchers found that the aluminum chemically reacted with the tantalum pentoxide when the capacitor was heated to 300° C. and significantly increased the leakage current of the capacitor. This issue has been addressed by Applicants' above-identified co-pending U.S. patent application Ser. No. 08/826,980 now U.S. Pat. No. 5,872,696. One inventive feature of this present application complements Applicants' co-pending application by enabling low-impedance connections to the capacitor's bottom electrode to be incorporated into the capacitor structures without substantially impacting the yield of the capacitor structures.

SUMMARY OF THE INVENTION

Broadly stated, a first invention of the present application encompasses a substrate capacitor comprising a base conducting layer, a base insulating layer over the base conductive layer, a plurality of apertures formed through the base insulating layer to the base conducting layer, and a multi-layer capacitance structure formed over the base insulating layer and the base conductive layer such that the bottom electrode of the multilayer capacitance structure makes electrical contact to the base conducting layer through the apertures in the base insulating layer. The base conducting layer may comprise a conductive substrate, such as a metal substrate, or may comprise a substrate of any material (e.g., dielectric, semiconductive, metal, etc.) with a top conductive layer formed over it. The base conductive layer provides a low impedance distribution plane for the substrate capacitor. The base insulating layer may comprise any dielectric material; in preferred embodiments it comprises spin-on polyamic acid which is cured to form a polyimide layer. The multilayer capacitance preferably comprises a main dielectric layer which may be formed by anodization and/or cured by anodization, and top and bottom electrode layers which are compatible with the main dielectric layer. In preferred methods of construction, the main dielectric layer is formed by anodization, or is cured by anodization, or is at least partially formed by anodization and is thereafter cured by anodization.

The base insulating layer provides a number of benefits according to the present invention. First, it physically isolates the multilayer capacitance structure from the base conducting layer, which can be a source of defects for the formation of the main dielectric layer (particularly for anodization processes). The base insulating layer tends to cover and encapsulate asperities and defect particles on the base conducting layer, and tends to fill in voids in the surface to provide a very smooth surface for forming the main dielectric layer. Such a smooth surface enables very thin dielectric layers to be reliably made. An anodizable dielectric for the main dielectric layer, which is used in preferred embodiments, provides the benefit of a high dielectric constant, which enables a high capacitance value to be achieved.

In further preferred embodiments, and as a further feature, at least one patch of dielectric material is formed over the bottom capacitance electrode or formed over the main dielectric layer, with each patch being located in the area overlying at least a portion of an aperture in the base insulating layer. The inventors believe that the areas in the multilayer capacitor structures that lie above the apertures formed in the base insulating layer have higher concentrations of defects in comparison to the areas formed over the base insulating layer. Each such patch of dielectric material prevents these defects from causing a shorting defect in the capacitor's main dielectric layer. The one or more patches may be formed by forming a layer of dielectric material over the bottom electrode of the multilayer capacitor structure or over the main dielectric layer, and thereafter selectively removing the layer to leave the patch(es). The thickness of the patch is preferably greater than the thickness of the main dielectric layer. If the patch is formed over the bottom capacitor electrode, the patch has the further benefit of preventing, during an anodization step, short circuits between an anodization bath and a non-anodizable base layer. This increases the yield and reproducibility of the anodization step.

A second invention of the present application encompasses a substrate capacitor comprising a base conducting layer having a surface and one or more conductive bodies projecting above the surface and electrically connected thereto (e.g., mesas). A multilayer capacitance structure is disposed over the base conductive layer such that the bottom electrode of the multilayer capacitance structure makes electrical contact to the base conducting layer through the contact apertures. The capacitance structure comprises a bottom electrode layer, a main dielectric layer (which comprises an anodizable material in preferred embodiments), and a top electrode layer. A patch of insulating material is formed over the bottom electrode layer or the main dielectric layer, and in the area of at least one projecting conductive body. The resulting structure is planarized, such as by mechanical polishing or chemical-mechanical polishing, to expose a portion of at least one projecting conductive body of the base conductive layer. Accordingly, connections to both the bottom and top electrodes of the substrate capacitor are provided at the top surface of the structure (the bottom electrode being coupled through the exposed projecting body of the base layer). The projecting body enables a low impedance conductive path to be made to the bottom electrode of the capacitor which is readily accessible to electrical traces which may be formed over the substrate capacitor. The patch of insulating material prevents the planarization process from creating conductive bridges between the electrode layers of the capacitance structure by increasing the distance between the capacitor's electrodes in the area where planarization occurs. The base insulating layer of the first invention and the apertures formed in the base layer may be incorporated into this second invention.

DETAILED DESCRIPTION OF THE DRAWINGS

FIG. 3 is a cross-sectional view of an exemplary substrate capacitor according to the present invention.

FIGS. 3A–3B show expanded views of an exemplary capacitance structure according to the present invention taken at the locations indicated at section markers 3A–3B, respectively, of FIG. 3.

FIG. 4 is a cross-sectional view of the exemplary substrate capacitor prior to the final polishing step, according to the present invention.

FIG. 4A shows an expanded view of an exemplary capacitance structure according to the present invention taken at the location indicated at section marker 4A of FIG. 4.

FIG. 5 is a cross-sectional view of another exemplary substrate capacitor according to the present invention.

FIGS. 5A–5C show expanded views of an exemplary capacitance structure according to the present invention taken at the locations indicated at section markers 5A–5C, respectively, of FIG. 5.

FIGS. 6A–6C show a processing flow diagram of a method that may be used to construct the exemplary substrate capacitors shown in FIGS. 3–5, according to the present invention.

DETAILED DESCRIPTION OF THE INVENTION

Figure 1:
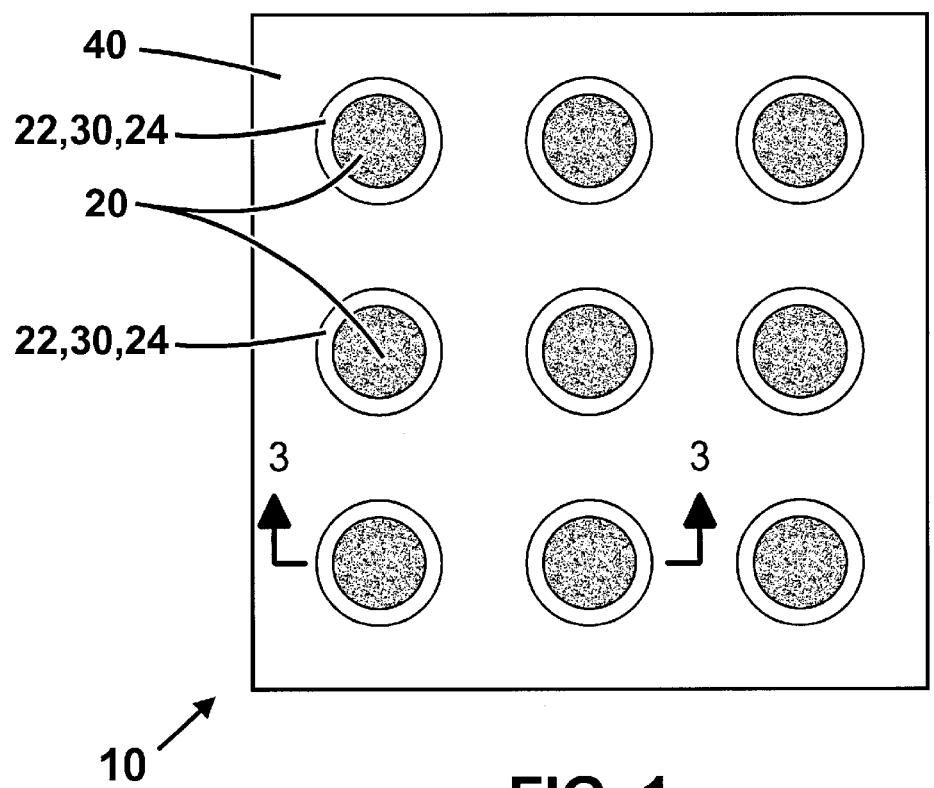
FIGS. 1 and 2 are top plan views of exemplary substrate capacitors according to the present invention.

FIG. 1 shows a top plan view of an exemplary substrate capacitor 10 according to the present invention. Substrate capacitor 10 may be used as a starting base for a multichip module substrate or a multichip carrier, or the like. Substrate capacitor 10 has a bottom electrode, a main dielectric layer, and a top electrode. Contacts to the bottom electrode are shown at 20 in FIG. 1, and the top electrode is shown at 40 in FIG. 1. The main dielectric layer is generally indicated at reference number 30 in FIG. 1. As described in greater detail below, reference number 30 also generally designates other material layers associated with the main dielectric layer of the capacitor structure. In preferred embodiments, bottom electrode contacts 20 and the top electrode 40 are at substantially the same height at the surface of substrate capacitor 10. Contacts 20 may have a round shape, as shown in FIG. 1, or may have other shapes, such as a square shape, as shown in FIG. 2.

Figure 2:
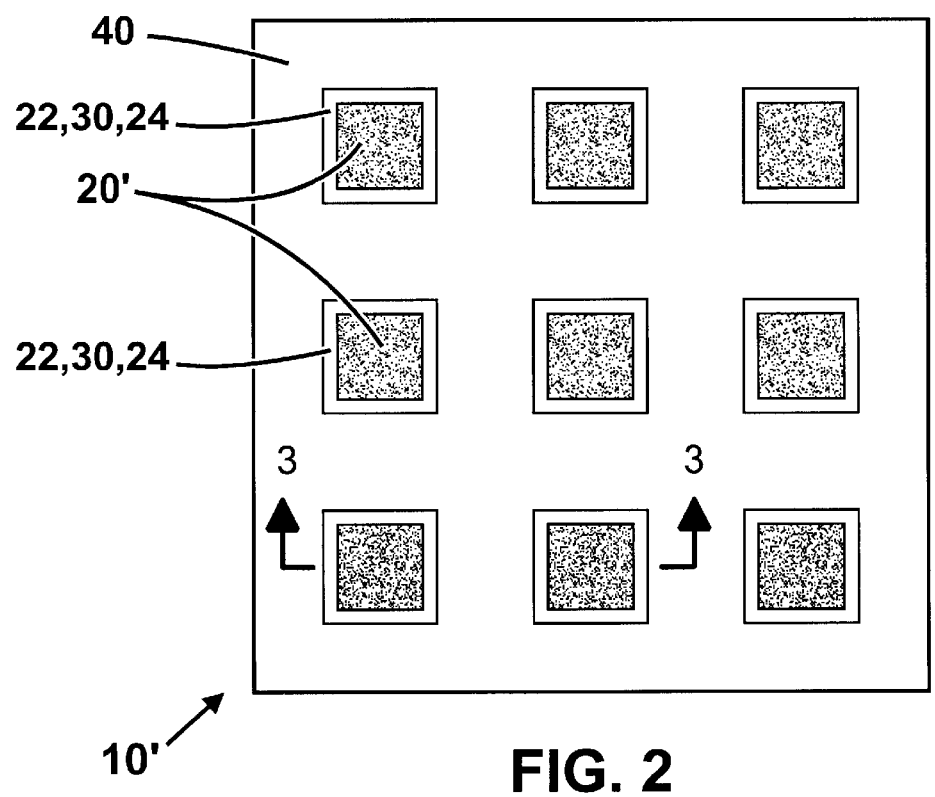

FIG. 3 shows a cross-sectional view of substrate capacitor 10 through line 3—3 shown in FIGS. 1 and 2. As shown in FIG. 3, substrate capacitor 10 comprises a base conducting substrate 12 and a plurality of contacts 20, which have the form of conductive bodies which project up from the surface of substrate 12 (e.g., mesas), and which are electrically coupled to the substrate 12. A layer 14 of a conductive, anodizable material may be disposed between base conducting substrate 12 and projecting-body contacts 20. Conductive substrate 12 may comprise a metal or its alloy, or may comprise a metal layer (or alloy) formed over a substrate of any type of material (e.g., dielectric, semiconductor, metal, etc.). In preferred embodiments for silicon chip MCM applications, substrate 12 comprises a molybdenum substrate, which provides a good coefficient of thermal expansion (CTE) match with silicon IC chips. Base substrate 12 and projecting-body contacts 20 collectively comprise a base conducting layer which has a surface area equal to the collective exposed surface areas of substrate 12 and the projecting conductive bodies of contacts 20.

Contacts 20 may be formed by forming a conductive layer 18 over layer 14, and thereafter etching the layer 18 to form the projecting bodies of contacts 20. The resulting projecting-body contact 20 has a flat top surface and one or more sloping surfaces (depending upon whether its top surface has a round shape or polygonal shape) disposed between the top surface and the surface of substrate 12. Layer 18 may comprise copper, and may be formed by first depositing a seed layer 16 of copper (such as by sputtering or evaporation), and thereafter electroplating copper to form the remainder of the layer 18. The projecting bodies of contacts 20 may typically have a height of between 30 $\mu$m and 40 $\mu$m. In preferred construction methods according to the present invention, layer 18 is formed with a thickness greater than the desired height of projecting bodies of contacts 20. After being patterned, layer 18 is planarized with a polishing process to bring the projecting bodies of contacts 20 to the desired height. The planarization process is described in greater detail below.

Substrate capacitor 10 further comprises a multilayer capacitance structure 30 which includes a main dielectric layer 34, and a number of surrounding conductive layers which are compatible with the main dielectric layer. FIGS. 3A–3B show expanded views of capacitance structure 30 taken at the locations indicated at section markers 3A–3B, respectively, of FIG. 3. One or more thin conductive layers 32–33 are formed below layer 34, and act as a bottom electrode for the capacitance structure 30. Layers 14 and 32–33 and substrate 12 collectively comprise the bottom electrode of substrate capacitor 10, with contacts 20 providing electrical contact to the bottom electrode from the top surface. A conductive layer 35 is formed over main dielectric layer 34, and acts as a top electrode of the capacitance structure 30. Layers 35 and 40 collectively comprise the top electrode of substrate capacitor 10.

The structure and composition of layers 32–35 are derived from Applicants' above-identified U.S. patent application, which will be summarized in greater detail below. In preferred implementations of capacitance structure 30, main dielectric layer 34 comprises a material which may be formed by anodizing an anodizable material, which enables a very thin layer of material having a high dielectric constant to be formed relatively reliably. Layers 32 and 33 comprise anodizable materials. Anodizable materials include, but are not limited to, valve metals (e.g., aluminum, tantalum, niobium, hafnium, antimony, bismuth, yttrium, and zirconium), oxides of valve metals, and nitrides of some of valve metals (e.g, tantalum nitride). Layer 35 acts as a chemical diffusion barrier between layers 34 and 40. Depending upon its composition, layer 35 may serve as an adhesion layer for layers formed above layer 35. If not, an adhesion layer may be optionally formed over layer 35.

As a first inventive feature of the present invention, a base insulating layer 22 is formed between base substrate 12 and the capacitance layers 32–33 of the capacitance structure 30. A plurality of apertures 23 are formed in the base insulating layer 22 to enable electrical contact to be made between layers 32–33 of the capacitance structure 30 and the base conducting layer 12. Once so contacted, layers 32–33 will have the same electrical potential as base conducting layer 12. In preferred embodiments where valve metal layer 14 is used, the contact occurs through the valve metal layer 14. Base insulating layer 22 preferably comprise polyimide, which is formed over substrate 12 (and contacts 20) by a spin-coating process. (In spin-coating processes, the dielectric material is dispensed in liquid form onto the surface of the substrate, and the substrate is thereafter rotated to cause the liquid material to spread out and uniformly coat the surface on a macroscopic level.) As is commonly done with dielectric layer formation, and in particular with polyimide layer formation, a thin adhesion layer is deposited first before the polyimide layer is formed. The adhesion layer is shown at 21 in FIG. 3, and typically comprises approximately 400 Å (Angstroms) of chromium metal. Other adhesion materials may, of course, be used For those embodiments where an anodized main dielectric layer 34 is employed, adhesion layer 21 is preferably removed in the areas beneath apertures 23, and layers 32 and 33 comprise anodizable materials. The removal of layer 21 in these regions leaves the valve layer 14 to directly contact the anodizable layers 32 and 33 of the capacitance structure 30. Accordingly, if there is a defect formed in layers 32 or 33 in the aperture region, valve layer 14 will be available to be anodized to provide a dielectric insulation between substrate 12 and the top electrode (layers 35 and 40) of substrate capacitor 10.

Over a large area such as that of a substrate capacitor, there are inevitably pin holes formed in sputtered layers which are commonly used to make the capacitor layers. If there are non-anodizable layers beneath the oxide layer and bottom electrode of the capacitor, it will not be possible to controllably anodize the oxide layer because there will be one or more shorting current paths from the anodization bath, through the pin holes, to the non-anodizable substrate material. Base insulating layer 22 helps to address this problem by isolating all but a relatively small fraction of the substrate material from the capacitor's bottom electrode and the capacitor's dielectric layer. The electrical contact from the bottom capacitor layers to the substrate are made through the apertures 23. As another benefit, layer 22 smooths over and encapsulates asperities and particles that are on the surface of substrate 12 and/or layer 14. Such asperities and particles may not normally be covered and completely encapsulated by the thin layers of capacitance structure 30. Asperities and particles could cause shorts to occur through main dielectric layer 34 if layer 22 were not present Encapsulation may be facilitated by making the thickness of layer 22 greater than the median diameter of the contaminant particles and median asperity heights that are expected, or estimated, to be found on the underlaying surface. Thicknesses of 1 $\mu$m to 10 $\mu$m are typical for layer 22, which are greater than the typical thicknesses of dielectric layer 34. In general, a smoother surface for layer 22 can be obtained when layer 22 is formed by spin-coating the material for layer 22, such as by spin-coating a polyimide precursor material.

As a second inventive feature of the present application, a dielectric patch 24, or cap layer 24, is formed on the sloping surfaces of each protruding-body contact 20, as shown in FIG. 3. Each patch 24 is typically formed between the main dielectric layer 34 and the top capacitor electrode layer 35, as shown in the expanded view of FIG. 3B but may be formed over the bottom electrode layers 32, 33. Each patch has a surface area which is smaller than the surface area of the base conducting layer provided by substrate 12 and projecting-body contacts 20. Patch 24 enables one to polish the surface of substrate capacitor 10 without creating defects in the layers of capacitance structure 30. With such a thin main dielectric layer 34 in the capacitance structure, there is very little spacing distance between electrode layers 33 and 35 and it is possible for a polishing process to create an electrical short between the electrodes layers by scraping conductive material across dielectric layer 34. Patch 24 increases the distance between the capacitor's electrodes in a region where the planarization occurs. In preferred embodiments of the present invention, patch 24 comprises a layer of polyimide due to its ease of formation. However, other dielectric materials may be used. In typical constructed embodiments, main dielectric layer 34 is formed by sputtering tantalum pentoxide ($Ta_2O_5$) onto an anodizable tantalum (Ta) layer and thereafter anodizing the tantalum layer and anodizing the sputtered oxide layer (in order to cure stoichiometric defects in the sputtered layer). Patch 24 may be deposited either before or after main dielectric layer 34 is deposited. Moreover, patch 24 may be formed either before or after the anodization step.

FIG. 4 shows a cross-sectional view of the substrate capacitor 10 prior to the planarization step. All of the above described layers may be seen therein. In FIG. 4, the full extent of the areas covered by patch 24 may be clearly seen. FIG. 4A shows an expanded view of capacitance structure 30 taken at the location indicated at section marker 4A of FIG. 4.

The inventors believe that the areas in the capacitance structure 30 which lie above apertures 23 have higher concentrations of defects (e.g., surface asperities, voids, and contaminant particles) in comparison to those areas formed over base insulating layer 22. As a further feature of the present application, a patch 26 of dielectric material is formed over the bottom capacitance electrode layer 32 and 33, or formed over the main dielectric layer 34, in the area overlying at least a portion of an aperture 23, as shown by a second substrate capacitor 100 in FIG. 5 (cross-sectional view). FIGS. 5A–5C show expanded views of capacitance structure 30 taken at the locations indicated at section markers 5A–5C, respectively, of FIG. 5. In preferred embodiments, a patch 26 of insulating material is formed for each aperture 23, and covers substantially all of the area of the aperture. Each patch 26 has a surface area which is smaller than the surface area provided by base conducting layer provided by substrate 12 and projecting-body contacts 20. Each patch 26 prevents defects present on the substrate 12 or valve-metal layer 14 from causing a shorting defect in the capacitor's main dielectric layer 34. If patches 26 are formed over the capacitor's bottom electrode, they have the further benefit of preventing, during an anodization step, short circuits between an anodization bath and a non-anodizable base conducting layer (e.g. a non-anodizable substrate 12). This increases the yield and reproducibility of the anodization step.

Patches 26 may be formed by forming a layer of dielectric material over the bottom electrode 33 of the multilayer capacitance structure (as shown by FIG. 5B) or over the main dielectric layer 34, (as shown by FIG. 5C) and thereafter selectively removing the layer to leave the patches. This step may be done as part of the steps for forming insulating patches 24, thereby saving on processing steps. The thickness of patches 26 is preferably greater than the thickness of main dielectric layer 34, greater than the median diameter of the contaminant particles that are expected, or estimated, to be found on the underlaying surface, and greater than the median height of the surface asperities that are expected, or estimated, to be on the surface. Thicknesses of 1 $\mu$m to 10 $\mu$m are typical for patches 26. In general, a smoother surface for patches 26 can be obtained when the layer used to form patches 26 is formed by spin-coating the material for the layer, such as by spin-coating a polyimide precursor material.

In each of FIGS. 3–5, the vertical dimensions of the layers have been expanded to make the various layer more visually apparent. Also, the horizontal dimensions of protruding-body contacts 20 have been expanded. The distance between contacts 20 is generally longer than that shown in the figures, which give more room for capacitance structure 30, and therefore more capacitance.

While it is currently preferred to incorporate the inventive features of base insulating layer 22 and the inventive features of insulating patches 24 into the same structure, it may be appreciated that each of these features provides its own set of benefits and that each feature is not dependent upon the presence of the other. Accordingly, insulating layer 22 and patches 24 may be used separately, as well as together. As an example of a separate use of patches 24, the base conducting layer 12 (or layer 18) may be etched to form projecting-body contacts 20, a dielectric material may be directly deposited or formed over the base conducting layer 12 (or 18), followed by the formation of patches 24 and the top electrode (e.g., layer 35 and/or 40). The resulting structure, which does not have to have base insulating layer 22 or bottom electrode layers 32 and 33, may then be planarized. As an example of a separate use of base insulating layer 22, the incorporation of patches 24 form the above described structures may be omitted, and the formation of projecting-body contacts 20 would be optional. If projecting-bodies of contacts 20 are omitted, contacts may be formed after the capacitor structure is formed by forming electrical vias through the dielectric layer to base substrate 12.

While it is currently preferred to incorporate the inventive features of base insulating layer 22 and the inventive features of insulating patches 26 into the same structure, it may be also appreciated that base insulating layer 22 may be used without patches 26.

Exemplary Construction Methods

Having thus described the various inventive structures of the present application, exemplary methods for constructing substrate capacitors with the inventive features of the present application are now described with simultaneous reference to FIGS. 3–5 and 6A–6C. Referring to FIG. 6A, a thin layer 14 of a valve material is formed over substrate 12, such as by sputtering 0.4 $\mu$m (4,000 Å) of tantalum, at processing block 202. It may be appreciated that various other valve metals may be used, such as aluminum, titanium, etc. Tantalum has the advantage of also acting as an adhesion layer for a subsequent copper layer, and is thus preferred. However, the dual use provided by tantalum is not critical to practicing the broadest embodiments of the present inventions. Next, as shown in block 204 of FIG. 6A, a thin layer 16 of conductive material is formed over valve metal layer 14, such as by sputtering 0.4 $\mu$m (4,000 Å) of copper. The thin conductive layer 16 serves as a seed layer for a subsequent electroplating process which will be used to build up layer 18. Preferably, layers 16 and 18 comprise a common metal, with copper being used in preferred embodiments due to its good conductivity and low cost. Next, as shown in block 206, a thick layer 18 of copper, or other conductive material, is formed over layer 16, such as by a plating process (preferably an electrolytic electroplating process). Next, as shown at block 208, projecting-body contacts 20 are formed from layer 18 by selectively etching away portions of layer 18. This may be readily accomplished by depositing a photoresist layer over layer 18, photo-patterning the photoresist layer, and thereafter exposing the entire structure to a copper-etch solution. Such patterning is well-known to the art and need not be described further herein for one of ordinary skill in the art to make and use the present invention. The copper etchant leaves exposed valve metal layer 14 in those areas between projecting-body contacts 20. Any number of well-known copper etchants may be used without impacting a tantalum valve-metal layer 14. To promote adhesion to the photoresist layer, a thin layer of chromium (e.g., 400 Å) may be sputtered over layer 18 before the photoresist layer is formed. In this case, once the photoresist is pattern exposed, the portions of the chromium layer exposed by the patterned photoresist layer are etched away prior to etching copper layer 18. Any number of chromium etchants may be used for this purpose, and it does not matter if the chromium etchant removes some of the underlying copper layer 18 since the copper layer is significantly thicker than the chromium layer.

Next, as shown at block 210, a thin adhesion layer 21 is formed over contacts 20. and the exposed portions of the valve metal layer 14. This may be done by sputtering approximately 0.04 $\mu$m (400 Å) of chromium metal, which provides good adhesion between metals and polymeric materials. Next, as shown in block 212 in FIG. 6B, layer 22 of polymeric material is formed over adhesion layer 21. In preferred embodiments of the present invention, layer 22 comprises polyamic acid, which is one of several precursor compounds for polyamide. Next, as shown at block 214, the polyamic acid layer 22 is pattern etched to form apertures 23, where capacitance structure 30 is to contact valve metal layer 14. The patterning may be accomplished by forming a photoresist layer over the polyamic acid layer, then patterning the photoresist layer, and thereafter transferring the pattern to the polyamic acid layer by an etching step. Performing such patterning and etching steps are well-known to the processing art and need not be described herein in order to enable one of ordinary skill in the art to make and use the present inventions. Also, one may use photo-imageable polymeric materials, which do not require a photoresist layer to pattern.

As the next step, as shown at block 216, layer 22 is cured, if curing is required to stabilize the dielectric material. In preferred constructed embodiments, layer 22 comprises polyamic acid and is cured to form a polyimide layer 22. In this case, layer 22 is cured up to a temperature of approximately 300° C., and preferably up to a temperature of at least 350° C. to 400° C.

Next, as shown at process block 218, the portions of adhesion layer 21 which appear at the bottoms of apertures 23 are removed by a suitable chemical etchant. This removal will expose the underlying portion of valve-metal layer 14, and will prevent the adhesion layer, which is usually non-anodizable, from causing a short-circuit to the anodizing bath in the case that there is a defect in the anodizable layers that will be formed over aperture 23. For a chromium layer 21, several etchants are known to the art which etch chromium without substantially etching tantalum, for example potassium permanganate ($KMnO_4$) in a basic solution (KOH or NaOH at a pH of 10–14) may be used. Cured polyimide layers are relatively immune to etching by typical chromium etchants.

Steps 212–218 thereby form the base insulating layer 22 with apertures 23. In preferred embodiments, base insulating layer 22 has a final cured thickness of approximately 10 $\mu$m. Since polyamic acid shrinks upon curing, the thickness of layer 22, as formed in block 212, is thicker than 10 $\mu$m by the appropriate shrinkage factor of the polyamic acid material (typically, the initial, uncured thickness is about 15 $\mu$m to 20 $\mu$m). It may be appreciated that polymeric layer 22 may be patterned after it has been cured. However, it is currently less expensive to pattern a polyamic acid layer than a polyimide layer, and therefore patterning before curing is currently preferred. Also, it may be appreciated that other dielectric materials may be used and other methods of deposition may be used. For example, silicon dioxide or forms of reflowable glass may be deposited by any of a number of well-known deposition methods. It may be appreciated that other dielectric materials may not require the curing step performed at process block 216.

At block 220, the layers of the capacitance structure 30 are formed. These layers comprise at least a bottom electrode layer 32, and a middle dielectric layer 34 which serves as the principal dielectric of the capacitance structure (i.e., that which mainly determines its capacitance). The capacitance layers may optionally include a top electrode layer and an adhesion layer. The formation of the capacitance structure 30 is not the central focus of the inventions of the present application. However, the inventions of the present application enhance the reliability and reproducibility of anodized capacitance structures. A preferred capacitance structure 30 and associated steps for forming it are provided in greater detail below after finishing the description of the general processing steps of FIGS. 6A–6C.

Next, as shown at block 222, an adhesion layer 35 is formed over the capacitance structure 30. In the preferred constructed implementations of capacitance structure 30 described below, the top capacitance electrode comprises a layer of tungsten. Tungsten provides good adhesion between tantalum pentoxide (which is used in the constructed implementations described below) and copper, and between tantalum pentoxide and polyimide (as well as between many other material combinations). As such, the steps of forming the top electrode layer and of forming the adhesion layer may be performed by the single step of forming the tungsten layer due to the dual benefits of tungsten. (As described in greater detail below, tungsten does not chemically react with tantalum pentoxide at elevated temperatures of up to at least 550° C.)

Next, as shown in block 224, a layer of polymeric material for forming patches 24 and 26 is formed over adhesion layer 35. In preferred embodiments of the present invention, this layer comprises polyamic acid, which is a precursor compound for polyamide. Next, as shown at block 226 in FIG. 6C, the polyamic acid layer is pattern etched to form patches 24 and 26, and to form apertures 25. (Top layer 40 will make contact to layer 35 through apertures 25.) The patterning may be accomplished by forming a photoresist layer over the polyamic acid layer, then patterning the photoresist layer, and thereafter transferring the pattern to the polyamic acid layer by an etching step. Performing such patterning and etching steps are well-known to the processing art and need not be described herein in order to enable one of ordinary skill in the art to make and use the present inventions. Also, one may use photo-imageable polymeric materials, which do not require a photoresist layer to pattern. It may be appreciated that these patterning steps form the substrate capacitor 100 shown in FIG. 5. If the substrate capacitor 10 (or 10') is desired, than the patterning step may be readily modified to omit the formation of patches 26. The omission of patches 26 increases the capacitance of capacitance structure 30 by increasing the area in which dielectric layer 34 is in direct contact with its top and bottom electrode layers, but decreases the yield of the structure.

As the next step, as shown at block 228, patches 24 and 26 are cured, if curing is required to stabilize the dielectric material. In preferred constructed embodiments, patches 24 and 26 comprise polyamic acid, which is cured to form polyimide. In this case, the patches are cured up to a temperature of approximately 300° C., and preferably up to a temperature of at least 350° C. to 400° C. Steps 224–228 thereby form patches 24 and 26. In preferred embodiments, patches 24 and 26 have final cured thicknesses of approximately 10 μm. Since polyamic acid shrinks upon curing, the thickness of initial polyamic acid layer in block 224 is thicker than 10 μm by the appropriate shrinkage factor. of the polyamic acid material (typically, the initial, uncured thickness is about 15 μm to 20 μm). It may be appreciated that the polymeric layer may be patterned after it has been cured. However, it is currently less expensive to pattern a polyamic acid layer than a polyimide layer, and therefore patterning before curing is currently preferred. Also, it may be appreciated that other dielectric materials may be used for patches 24 and 26, and other methods of deposition may be used. For example, silicon dioxide or forms of reflowable glass may be deposited by any of a number of well-known deposition methods.

Next, as shown at block 230 in FIG. 6C, a thin adhesion layer is formed over patches 24 and 26. This may be done by sputtering approximately 0.04 μm (400 Å) of tungsten metal, which provides good adhesion between metals and polymeric materials. Next, as shown in block 232, thick conductive layer 40 is formed over the adhesion layer. This may be accomplished by sputtering approximately 0.4 μm (4,000 Å) of copper, followed by plating several microns of copper material, typically about 40 μm to 60 μm. The initial sputtered layer provides an initial seed layer upon which the plating operation may start, the thickness being sufficient for step coverage and uniform electrical conductivity over the surface. Sputtering and plating methods are well known to the art and need not be described herein for one of ordinary skill in the art to make and use the present invention.

As a final major processing step, the resulting structure is polished to expose contacts 20, and to preferably make the top surface of the structure planar. The polishing may be accomplished in a number of ways. The inventors prefer to use the novel polish method described in co-pending U.S. patent application Ser. No. 08/717,266, entitled "METHODS OF PLANARIZING STRUCTURES ON WAFERS AND SUBSTRATES BY POLISHING," assigned to the same assignee of the present application, and incorporated herein by reference. In the polishing method, a tungsten polish-stop layer is formed over the surface to be polished (shown at 50 in FIG. 4), and the resulting structure is polished in an abrasive slurry which has phosphoric acid ($H_3PO_4$) added to it. The phosphoric acid causes the tungsten polish-stop layer to become more resistant to abrasive polishing action, while not substantially increasing or decreasing the polishing resistance of the copper or of the polymeric material.

Phosphoric acid is added to a standard commercial polishing slurry to reduce the pH of the slurry from an initial value of over 7 to at least a value of 6, and more preferably to a value of less than 4. For typical silica slurries, the phosphoric acid typically has a concentration of at least 0.001 percent by weight of the slurry, and preferably at least 0.01 percent by weight of the slurry. For typical slurry solutions, these percentages correspond to having a molarity of at least 0.0011, and preferably of at least 0.011. The inventors have successfully used slurries with a pH range of 2 through 4. In one example, a 14.8 molar solution of phosphoric acid is added to a silica slurry to produce a modified slurry solution such that the phosphoric acid solution comprises 0.02% by volume of the modified slurry solution. The starting slurry solution comprises approximately 97.5% water, 2.5% fumed amorphous silica, and trace amounts of hydroxide. The modified slurry solution has a pH of approximately 3.5. In another example, a 14.8 molar solution of phosphoric acid is added to the starting silica slurry such that the phosphoric acid solution comprises 3.5% by volume of the modified slurry solution. The modified slurry solution has a pH of approximately 2.

After the polishing step is completed, the substrate capacitor 10,100 may be used as desired. Typically, for multichip module applications, alternating layers of conductive traces and dielectric layers (e.g., copper and polyimide layers) may be formed over the substrate capacitor to form a multichip module (MCM) with an integrated capacitor within.

Preferred Implementation of Capacitance Structure 30

In a preferred implementation of capacitance structure 30, conductive layer 32 comprises aluminum, conductive layer 33 comprises tantalum nitride (TaN), and dielectric layer 34 comprises tantalum pentoxide ($Ta_2O_5$). Layer 32 of aluminum is formed over base insulating layer 22 and apertures 23 (through to the exposed portions of value metal layer 14) to a thickness of between 1 μm to 3 μm. Standard deposition processes well known to the art may be used, such as direct-current (D.C.) magnetron sputtering.

Thereafter, 5,000 Å (0.5 μm) of tantalum nitride (TaN) is sputtered over the aluminum conductive layer 32 to form a tantalum nitride conductive layer 33. As one employed processing approach, a D.C. magnetron system with a tantalum target is used, with the system set at a power level 1.55 kW. The chamber pressure is set to 10 milli-torr (mT), with 75 sccm argon(Ar) and 10 sccm nitrogen ($N_2$) flowing into the sputtering chamber (one sccm is one standard cubic centimeter of gas per minute, and one standard cubic centimeter of gas is measured at 25° C. and one standard atmosphere). Under these conditions, tantalum is sputtered from the target to form tantalum nitride with the nitrogen gas (reactive sputtering), and the tantalum nitride film grows at a rate of approximately 1.33 Å per second. The nitrogen flow rate may be varied between 5 sccm and 15 sccm under the above conditions.

Thereafter, approximately 600 Å of tantalum (T) is sputtered over tantalum nitride layer 33 to form a tantalum precursor layer for dielectric layer 34, which will be formed in this exemplary embodiment by anodization. This step may follow immediately after the sputtering of tantalum nitride layer 33 in the same sputtering chamber and without breaking the vacuum. Preferably, the tantalum is sputtered so that the deposited layer is in the beta form, so called β-tantalum. This form of tantalum, in contrast with the alpha-form (α-tantalum), has been found to provide better anodized layers, and may be formed by sputtering tantalum in an argon atmosphere. As one employed processing approach, a D.C. magnetron system with a tantalum target is used, with the system set at a power level 1.0 kW. No applied substrate bias is used. The chamber pressure is set to 10 milli-torr (mT), with 75 sccm argon(Ar) flowing into the sputtering chamber. Under these conditions, a β-tantalum film grows at a rate of approximately 1.0 Å per second.

Next, approximately 500 Å of tantalum pentoxide ($Ta_2O_5$) is sputtered over the tantalum precursor layer as part of forming dielectric layer 34. In this case, dielectric layer 34 will be formed from two sublayers: (1) a tantalum precursor sub-layer which will be anodized, and (2) a sputtered tantalum pentoxide ($Ta_2O_5$) sub-layer. As one employed processing approach, an R.F. magnetron system with a tantalum target is used, with the system being set at a power level 1.55 kW. This step may follow immediately after the sputtering of the tantalum layer in the same sputtering chamber and without breaking the vacuum. The chamber pressure is set to 10 milli-torr (mT), with 75 sccm argon(Ar) and 25 sccm oxygen ($O_2$) flowing into the sputtering chamber. At these conditions, the film grows at a rate of approximately 0.2 Å per second.

The resulting structure is then anodized to correct the stoichiometry of the sputtered tantalum pentoxide sub-layer, and to completely anodize the underlying elemental β-tantalum sub-layer to thereby form dielectric layer 34. Approximately 2,000 Å of tantalum pentoxide ($Ta_2O_5$) results from the anodization, approximately 1,500 Å provided by the anodization of the alum precursor sub-layer. The current, time, and voltage required to anodize the tantalum precursor layer can be readily calculated by the teachings in the anodization art. For tantalum pentoxide, the coulombic efficiency of the anodization process is very close to 100%. Accordingly, the amount of charge required to chemically oxidize a given amount of tantalum can be easily determined, and this amount can be readily measured during the anodization process by time-integrating the anodization current. A common anodization technique uses a constant anodization current, stops after a set time interval to arrive at the charge amount. Other anodization control methods measure the anodization voltage and rely upon the empirical rule that each volt increase in potential results in approximately 16.5 Å increase in oxide thickness.

In preferred implementations of capacitance structure 30, the anodization of the tantalum precursor sub-layer is carried out such that a portion of the tantalum nitride (TaN) layer 33 is anodized to form a thin tantalum oxy-nitride layer ($TaO_xN_y$) having a thickness on the order of 200 Å to 400 Å. This may be done by running the anodization process past the time computed above by a predetermined amount. Each 100 Å of tantalum oxy-nitride requires approximately 17.5 milli-Coulombs (mC) per square centimeter. Accordingly, the growth of 200 Å to 400 Å of tantalum oxy-nitride can be readily achieved by extending the anodization time by an amount determined by the anodization current and the 17.5 $mC/cm^2$ figure (the time for each 100 Å equals $0.0175/I_A$, where $I_A$ is the anodization current per square centimeter).

Preferably, the anodization current is gradually increased at the beginning of the anodization process from zero amperes to a working value over one or more minutes, and thereafter maintained at the working value. The gradual ramping of current enables an orderly diffusion of oxygen species through the sputtered tantalum pentoxide sub-layer before full current is applied. As one employed processing approach, an anodization bath comprising 0.01% citric acid in water is used at 70° C. An anodization current of 0.27 $mA/cm^2$ is used, with the current being ramped up to that value from zero amperes over a period of 1.5 minutes in a substantially linear manner. The anodization current is maintained at that level for approximately 18 minutes, after which it is ramped back to zero amperes over a 1.5 minute period in a substantially linear manner.

After anodization, top electrode layer 35 is formed over the $Ta_2O_5$ dielectric layer 34. In preferred implementations, top electrode layer 35 comprises a material which does not chemically reduce tantalum in the $Ta_2O_5$ dielectric layer 34, up to temperatures of at least 350° C., and preferably up to temperatures of at least 450° C., and more preferably up to temperatures of at least 550° C. The inventors have found that molybdenum (Mo) and tungsten (W) do not chemically reduce the tantalum in $Ta_2O_5$ at temperatures up to at least 550° C., and are suitable choices for layer 35. It may be appreciated that layer 35 may be a composite of materials, with a non-chemically reducing material as a bottom sub-layer. For the exemplary embodiments used herein, layer 35 may comprise tungsten (W), which provides the above benefits and which also provides good adhesion between tantalum pentoxide and copper (such as which may be used for layer 40), and between tantalum pentoxide and many polymeric dielectric materials (such as that which may be used for patches 24 and 26).

The arrangement and composition of the above-described layers has a number of advantages. First, the sputtered $Ta_2O_5$ sublayer for dielectric layer 34 and its position within the structure provides dielectric layer 34 with relatively low leakage current on the microscopic level, much lower than can be achieved from anodizing an elemental tantalum layer. However, sputtered $Ta_2O_5$ layers have a relatively high number of pin-hole defects, on the order of 2 to 5 per square centimeter. When a sputtered $Ta_2O_5$ layer is used alone as a dielectric layer, the pin-hole defects in the sputtered layer create large, and unacceptable, leakage currents, making sputtered $Ta_2O_5$ layers useless for capacitors greater than 0.25 square centimeter. The inventors characterize this by stating that sputtered $Ta_2O_5$ layers have low "microscopic" leakage current (very low in any one small area), but large "macroscopic" leakage currents (very large in any large area).

In contrast, the anodization of the tantalum precursor layer has been found to create a dielectric layer with much fewer pin-hole defects, leading to a low macroscopic leakage current, but with a larger microscopic leakage current. It is believed that elemental tantalum migrates through the dielectric layer during the anodization process as the dielectric layer is being created, thereby creating conductive paths through the dielectric layer on a microscopic level. However, since the sputtered $Ta_2O_5$ sub-layer is in series with the sub-layer produced by the anodization of the tantalum precursor sub-layer, the overall oxide dielectric layer 34 obtains the benefits of both sublayers, low microscopic leakage current being provided by the sputtered sub-layer and low pin-hole defects and low macroscopic leakage current being provided by the anodized precursor sub-layer. This implementation of capacitance structure 30 has obtained pin-hole defects lower than 0.02 defects per square centimeter, whereas sputtered $Ta_2O_5$ layers have defects on the order of 5 per square centimeters or more. This represents a reduction in pin-hole defects by a factor of over 250.

Tantalum nitride layer 33 and its position within the capacitance structure 30 provides a number of advantages. First, the inventors have found tantalum nitride to act as a good high temperature diffusion barrier between aluminum (Al) and tantalum pentoxide ($Ta_2O_5$), preventing aluminum in layer 32 from diffusing into the $Ta_2O_5$ dielectric layer 34 during subsequent high temperature processing steps. For this purpose, the thickness of tantalum nitride layer 33 is preferably at least 2,000 Å, and more preferably is at least 4,000 Å (Angstroms). Second, tantalum nitride anodizes to fill any pin-hole defects in the tantalum precursor layer above it, thereby reducing defect densities in capacitance structure 30, and thereby increasing manufacturing yields.

Third, tantalum nitride layer 33 operates in conjunction with the complete anodization of the tantalum precursor layer to oxidize the elemental tantalum which has diffused into the $Ta_2O_5$ dielectric layer 34 during the anodization of the tantalum precursor layer. In the conventional prior art formation methods, a tantalum layer would only be partially anodized so that the bottom portion can serve as the capacitor's bottom electrode. During conventional anodization, elemental tantalum is continually released from the metal layer and diffuses through the oxide layer toward the open surface. During the same time, oxygen species diffuse in the reverse direction from the open surface into the oxide layer and toward the substrate. After partial anodization, elemental tantalum remains distributed within the oxide layer, leading to microscopic conduction paths within the oxide layer. In this implementation of capacitance structure 30, the tantalum nitride layer 33 serves as the capacitor's bottom electrode so that the tantalum precursor layer may be completely anodized. It is believed by the inventors that, during the anodization of the tantalum nitride layer 33, elemental tantalum is released from the layer at a much lower rate than that which occurs during the anodization of an elemental tantalum layer. Accordingly, after complete anodization of the tantalum precursor layer, the release of elemental tantalum into the oxide dielectric layer 34 is reduced substantially while the tantalum nitride layer is being anodized, which enables the migrating oxygen species to oxidize off the tantalum which has diffused into layer 34, which reduces the microscopic conduction paths caused by the elemental tantalum. Leakage current is thereby reduced.

It is believed by the inventors that the tantalum oxy-nitride layer provides a number of advantages as well. First, as mentioned above, the formation of oxy-nitride layer ensures that all of the tantalum from the tantalum precursor layer is completely anodized, thereby reducing leakage currents. Second, the relative dielectric constant of tantalum nitride is sufficiently high, being in the range of 13 to 18, that the formation of the tantalum nitride does not significantly lower the capacitance value of the capacitor, which is determined primarily by the dielectric constant of the tantalum pentoxide, which is approximately 25. In preferred implementations, the thickness of the tantalum oxy-nitride layer is at least 75 Å, and more preferably is at least 150 Å. However, because the dielectric constant of the tantalum oxy-nitride is lower than that of tantalum pentoxide, it is preferable to have a thickness of tantalum nitride which is not more than one-half the thickness of the final tantalum pentoxide layer (for example, 2,000 Å/2=1,000 Å), and more preferable to have a thickness which is not more than one-fourth of the thickness of the final tantalum pentoxide thickness (for example, 2,000 Å/4=500 Å).

In order to be a practical integrated bypass capacitor, the leakage current should be below 1 micro ampere per square centimeter of capacitor area at applied voltages of 10 volts (cathodic and anodic). This construction of capacitance structure 30 can achieve leakage currents of less than 0.1 micro-amperes per square centimeter, under both cathodic and anodic polarization conditions, after the capacitance structure has been exposed to temperatures over 350° C. over several hours.

While the above construction for capacitance 30 is preferred by the inventors, it may be appreciated that other capacitance structures may be used with the inventive features of the present application.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A capacitor formed on a substrate, said capacitor comprising:
    a base conducting layer having a surface area;
    a base insulating layer disposed over the base conducting layer;
    a plurality of apertures in said base insulating layer;
    a first conductive electrode layer disposed over the base insulating layer and electrically coupled to the base conducting layer through at least one of said apertures, said first conductive electrode layer and said base conducting layer having the same potential;
    a dielectric layer disposed over said first conductive electrode layer; and
    a second conductive electrode layer disposed over said dielectric layer.

2. The capacitor of claim 1 wherein the substrate comprises a conductive substrate, and wherein said base conducting layer comprises said conductive substrate.

3. The capacitor of claim 1 wherein said base conducting layer comprises a conductive layer formed over the substrate.

4. The capacitor of claim 1 wherein said base insulating layer comprises a layer of polyimide having a thickness greater than the thickness of said dielectric layer.

5. The capacitor of claim 1 wherein said base insulating layer comprises a layer of material which is formed by spin coating.

6. The capacitor of claim 1 wherein said base insulating layer has a thickness of at least 1 µm.

7. The capacitor of claim 1 wherein said dielectric layer comprises an oxide of an anodizable metal.

8. The capacitor of claim 1 further comprising a patch of insulating material, said patch being disposed over said first conductive electrode layer or said dielectric layer, and located in the area which overlays at least a portion of one said aperture, said patch having a surface area which is less than the surface area of said base conducting layer.

9. The capacitor of claim 8 wherein said patch has a thickness which is greater than the thickness of said dielectric layer.

10. The capacitor of claim 8 wherein said patch is disposed over said first conductive electrode layer.

11. The capacitor of claim 8 wherein said patch has a thickness of at least 1 µm.

12. The capacitor of claim 1 wherein said base conducting layer comprises a surface and one or more conductive bodies projecting above the surface and electrically connected to the surface of said base conducting layer.

13. The capacitor of claim 12 further comprising a patch of insulating material, said patch being disposed over said first conductive electrode layer or said dielectric layer, and located in the area which overlays at least a portion of one of said projecting bodies, said patch having a surface area which is less than the surface area of said base conducting layer.

14. The capacitor of claim 13 wherein said patch has a thickness which is greater than the thickness of said dielectric layer.

15. The capacitor of claim 1 wherein the surface of said base conducting layer comprises a valve metal in at least one area underlying at least one said aperture, and wherein said first conductive electrode layer comprises a valve metal.

16. A capacitor formed on a substrate, said capacitor comprising:
   a base conducting layer, said base conducting layer having a conductive top surface, one or more conductive bodies projecting above said top surface and electrically connected to said top surface, and a surface area formed by said one or more conductive bodies and said conductive top surface;
   a dielectric layer disposed above said base conducting layer;
   a patch of insulating material disposed over said base conducting layer or said dielectric layer, and located in the area which overlays at least a portion of one of said projecting bodies, said patch having a surface area which is smaller than the surface area of said base conducting layer; and
   a second conductive electrode layer disposed over said dielectric layer.

17. The capacitor of claim 16 wherein the substrate comprises a conductive substrates, and wherein said base conducting layer comprises said conductive substrate.

18. The capacitor of claim 16 wherein said base conducting layer comprises a conductive layer formed over the substrate.

19. The capacitor of claim 16 wherein said dielectric layer comprises an oxide of an anodizable metal.

20. The capacitor of claim 16 wherein said patch has a thickness which is greater than the thickness of said dielectric layer.

21. The capacitor of claim 16 wherein said patch has a thickness of at least 1 $\mu$m.

22. The capacitor of claim 16 wherein a projecting body has a flat top surface and one or more sloping surfaces disposed between its top surface and the conductive top surface of said base conducting layer, and wherein said patch of insulating material overlays at least one sloping surface of a projecting body.

* * * * *